(12) United States Patent
Lien et al.

(10) Patent No.: US 12,212,338 B1
(45) Date of Patent: Jan. 28, 2025

(54) SYNDROME DECODER CIRCUIT

(71) Applicant: Winbond Electronics Corp., Taichung (TW)

(72) Inventors: Chuen-Der Lien, Los Altos Hills, CA (US); Chi-Shun Lin, Fremont, CA (US); Ngatik Cheung, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 77 days.

(21) Appl. No.: 18/358,972

(22) Filed: Jul. 26, 2023

(51) Int. Cl.
| | |
|---|---|
| *G06F 11/10* | (2006.01) |
| *G06F 11/07* | (2006.01) |
| *G06F 11/30* | (2006.01) |
| *G06F 13/16* | (2006.01) |
| *G06F 13/28* | (2006.01) |
| *H03M 13/11* | (2006.01) |
| *H03M 13/15* | (2006.01) |

(52) U.S. Cl.
CPC ... *H03M 13/1575* (2013.01); *H03M 13/1108* (2013.01)

(58) Field of Classification Search
CPC .............. H03M 13/1108; H03M 13/1575
See application file for complete search history.

(56) References Cited

U.S. PATENT DOCUMENTS

| | | | | |
|---|---|---|---|---|
| 4,566,105 A * | 1/1986 | Oisel | ..................... | H03M 13/27 714/756 |
| 10,853,167 B2 | 12/2020 | Lien et al. | | |
| 2011/0103400 A1 * | 5/2011 | Wezelenburg | .... | H03M 13/6502 370/474 |
| 2014/0229786 A1 * | 8/2014 | Poolakkaparambil | ...................... | G06F 11/1402 714/746 |
| 2014/0317470 A1 * | 10/2014 | Chung | ................ | G06F 11/1048 714/764 |
| 2015/0007001 A1 * | 1/2015 | Kern | .................. | H03M 13/159 714/785 |
| 2018/0068726 A1 * | 3/2018 | Song | ..................... | G11C 16/16 |
| 2020/0111537 A1 * | 4/2020 | Chen | ...................... | G11C 29/14 |
| 2023/0060107 A1 * | 2/2023 | Ishikawa | ................ | G11C 29/52 |

FOREIGN PATENT DOCUMENTS

| | | |
|---|---|---|
| CN | 102099793 | 10/2013 |
| TW | I706416 | 10/2020 |

* cited by examiner

*Primary Examiner* — Guy J Lamarre
(74) *Attorney, Agent, or Firm* — JCIPRNET (57) ABSTRACT

The disclosure describes a syndrome decoder circuit including: a syndrome computation circuit configured to receive K bits of message bits and P bits of parity bits to calculate S bits of syndrome bits; a X bits weight correction circuit configured to receive multiple sets of first number of bits of the syndrome bits and a first digits of the K bits of message bits to generate a first set of correction masks for the first digits of K bits of message bits; and a X−1 bits weight correction circuit configured to receive multiple sets of second number of bits of the syndrome bits and a second digits of the K bits of message bits to generate a second set of correction masks for the second digits of K bits of message bits. The first number is not equal to the second number.

19 Claims, 6 Drawing Sheets

SYNDROME DECODER CIRCUIT

TECHNICAL FIELD

The disclosure is directed to a syndrome decoder circuit performing syndrome decoding.

BACKGROUND

A conventional syndrome decoder would receive the codeword containing message bits and parity bits and subsequently generate syndrome bits. The syndrome bits are essentially a pattern of errors from which erroneous bit(s) could be identified. Under a typical scheme, if all syndrome bits turn out as expected, then there is no error in the codeword.

However, for a conventional ECC syndrome decoder, as the number of message bits increase, the number of parity bits may also increase. As a codeword becomes larger, the conventional syndrome decoding scheme could become less practical since the circuit area could become quite large and the time delay to due to error checking could be significant. Therefore, there is a need for a different decoding circuit which requires less inputs so as to save circuit area and to reduce power consumption.

SUMMARY OF THE DISCLOSURE

The disclosure provide a syndrome decoder which includes: a syndrome computation circuit configured to receive K bits of message bits and P bits of parity bits so as to calculate S bits of syndrome bits; a X bits weight correction circuit configured to receive multiple sets of first number of bits of the S bits of syndrome bits and a first digits of the K bits of message bits so as to generate a first set of correction masks for the first digits of the K bits of message bits; and a X−1 bits weight correction circuit configured to receive multiple sets of second number of bits of the S bits of syndrome bits and a second digits of the K bits of message bits so as to generate a second set of correction masks for the second digits of the K bits of message bits, wherein K, P, and S are integers greater than 0, the first digits of the K bits of message bits include a most significant bit of the K bits of message bits, and the first set of correction masks and the second set of correction masks are generated simultaneously, wherein the first number is not equal to the second number.

The disclosure also provide a syndrome decoder which includes: a syndrome computation circuit configured to receive K bits of message bits and P bits of parity bits so as to calculate S bits of syndrome bits; a X bits weight correction circuit configured to receive multiple sets of first number of bits of the S bits of syndrome bits and a first digits of the K bits of message bits so as to generate a X−1 bits enable signal and a first set of correction masks for the first digits of the K bits of message bits; and a X−1 bits weight correction circuit configured to receive multiple sets of second number of bits of the S bits of syndrome bits, a second digits of the K bits of message bits, and the X−1 bits enable signal so as to generate a X−2 bits enable signal and a second set of correction masks for the second digits of the K bits of message bits, wherein K, P, and S are integers greater than 0, the first digits of the K bits of message bits include a most significant bit of the K bits of message bits, and the second number is less than the first number.

DETAILED DESCRIPTION OF DISCLOSED EMBODIMENTS

Figure 1:
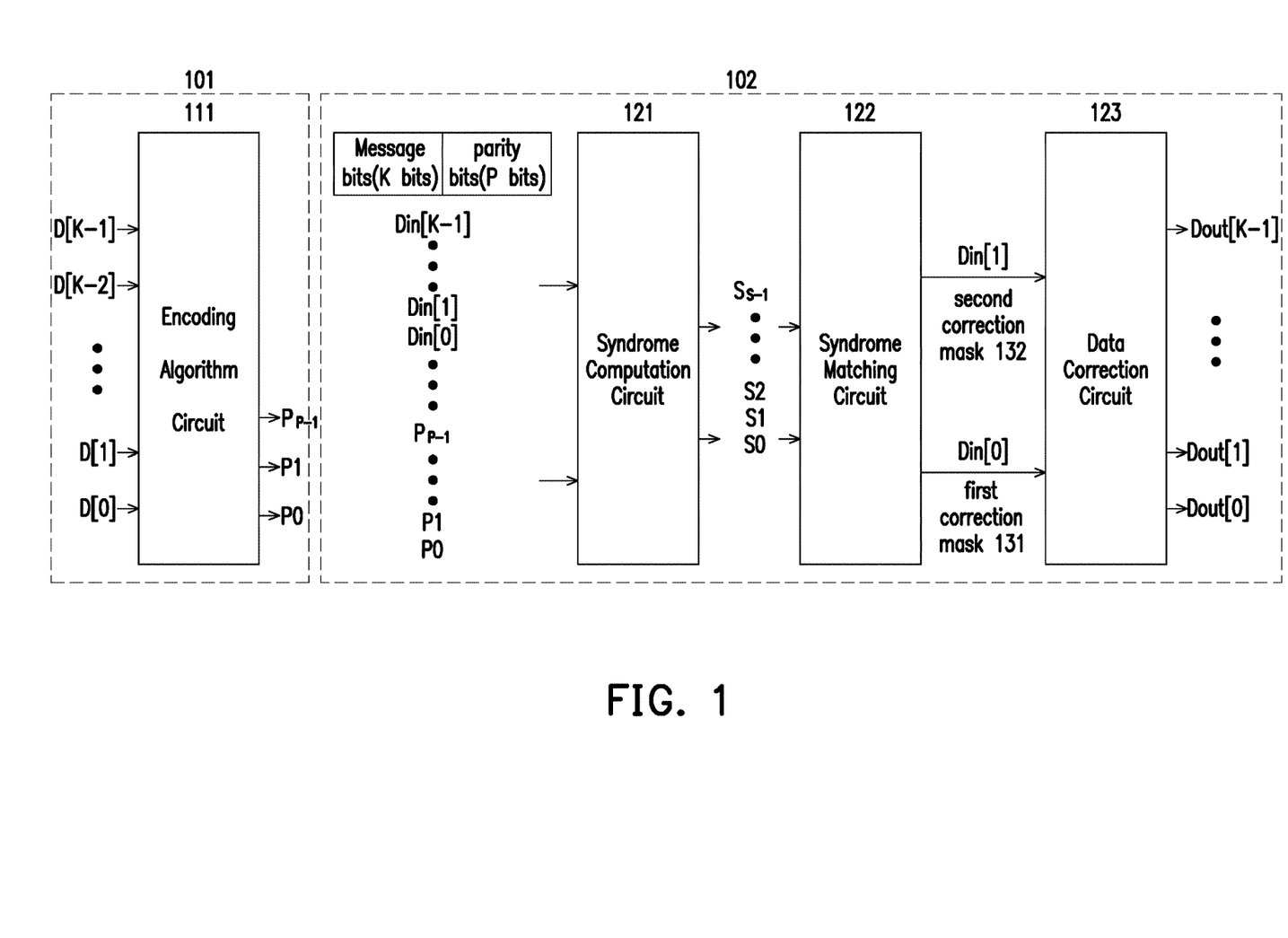
FIG. 1 illustrates a block diagram of a syndrome encoder circuit and a syndrome decoder circuit according to an exemplary embodiment of the disclosure.

FIG. 1 shows the block diagram of a syndrome encoder circuit 101 and a syndrome decoder circuit 102. The syndrome encoder circuit 101 may include not limited to an encoding algorithm circuit 111 which receives K bits of an original message bits with D[0] being the least significant bit and D[K−1] being the most significant bit so as to generate parity bits P0, P1, . . . , Pp−1, etc. based on a known generator algorithm. The K bits of the original message bits along with the parity bits could be transmitted as a codeword via a transmitter. The codeword may include the K bits of the original message bits and the P bits of the parity bits attached to the end of the K bits of the original message bits.

Upon receiving the codeword by a syndrome decoder circuit 102, the codeword would be decoded utilizing the parity bits to recover the original message bits by correcting errors which may exist in the codeword. In detail, after the codeword is received by the decoder, it is usually received as a codeword containing K bits of messages bits (e.g. Din[0], Din[1], . . . . Din[K−1]) and P bits of the parity bits (e.g. P0, P1, . . . , Pp−1, etc). Assuming that no error has occurred during the transmission, the K bits of the message bits and the P bits of the parity bits of the received codeword could match the transmitted codeword having original message bits (e.g. D[0], D[1], . . . . D[K−1]) and parity bits (e.g. P0, P1, . . . , Pp−1, etc).

The syndrome decoder circuit 102 may include a syndrome computation circuit 121, a syndrome matching circuit 122, and a data correction circuit 123. The syndrome computation circuit 121 would calculate S bits of the syndrome bits (S0, S1, S2, . . . , Ss−1) from the K bits of the message bits and the P bits of the parity bits from the received codeword, assuming that the quantity of the S bits of the syndrome bits equals to the quantity of the P bits of the parity bits. After S bits of the syndrome bits are calculated, the syndrome matching circuit 122 would receive the S bits of the syndrome bits to detect one or more bit errors. Based on S bits of the syndrome bits, the syndrome matching circuit 122 would determine a set of correction masks (including a plurality of correction masks, such as correction_mask [0] . . . correction_mask [K−2], correction mask [K−1] as shown in FIG. 2) with each correction mask corresponding to each bit of the K bits of the message bits.

Each correction mask would indicate whether each of the corresponding K bits of the message bits contains an error.

The data correction circuit 123 would receive results from the set of correction masks from the syndrome matching circuit 122 as well as the K bits of the message bits (e.g. Din[0], Din[1] . . . . Din[K−1]) so as to correct one of the message bits in which a bit error has been indicated from its corresponding correction mask if such bit error exists. In FIG. 1 for example, assuming that a first correction mask 131 which corresponds to Din[0] indicates no error and a second correction mask 132 which corresponds to Din[1] indicates an error, the data correction circuit 123 would flip the binary value of Din[1] so as to correct Din[1]. Subsequently, the data correction circuit 123 would output the K bits of output message bits (e.g. Dout [0], Dout [1] . . . . Dout [K−1]) which should resemble the original message bits.

Figure 2:
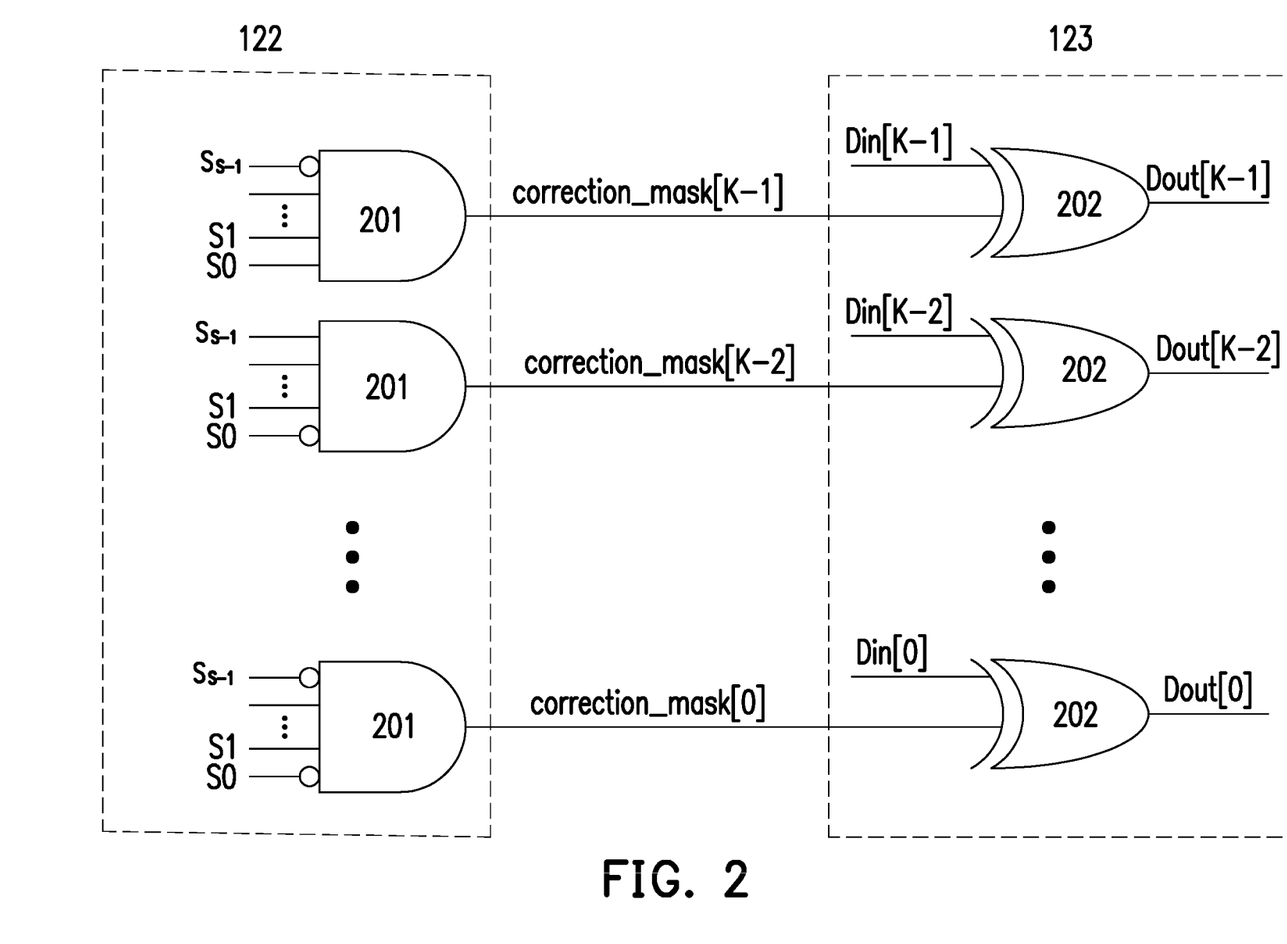
FIG. 2 illustrates an implementation of a syndrome matching circuit and a data correction circuit according to an exemplary embodiment of the disclosure.

One simple implementation of the syndrome matching circuit 122 and the data correction circuit 123 is shown in FIG. 2. The syndrome matching circuit 122 would include a first plurality of logic gates 201 and each of the first plurality of the logic gates 201 would receive all of the S bits of the syndrome bits. This means that all of the S bits of the syndrome bits (e.g. S0, S1 . . . . Ss−1) would input into each of the first plurality of logic gates 201 of the syndrome matching circuit 122. The purpose of the syndrome matching circuit 122 is to output a set of correction masks with each correction mask indicating whether its corresponding bit contains an error. For the K bits of message bits (e.g. Din[0], Din[1] . . . . Din[K−2], Din[K−1]), there would be K bits of correction masks (e.g. correction mask [0], correction mask [1] . . . correction mask [K−2], correction mask [K−1]) where Din[0] corresponds to correction mask [0], Din[1] corresponds to correction mask [1], and so forth. The data correction circuit 123 may include a second plurality of logic gates 202 designed to flip one of the input message bits in response to the correction mask corresponding the one of the input message bits having indicated an error. The implementation of the syndrome matching circuit 122 and the data correction circuit 123 could be improved further by reducing the number of inputs of each of the logic gates of the syndrome matching circuit 122.

Figure 3:
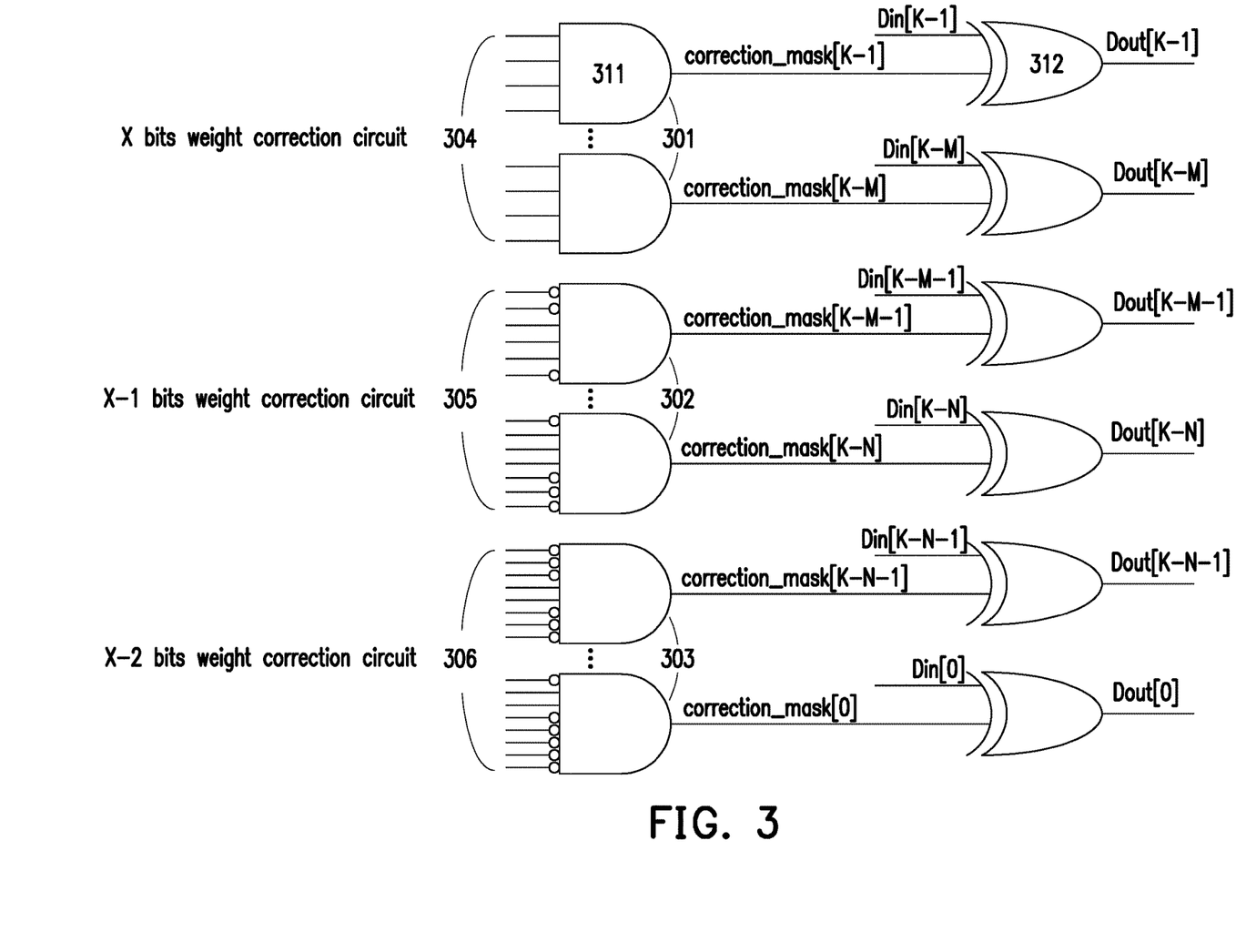
FIG. 3 illustrates a hardware diagram of the X-bits weight correction circuit according to a first exemplary embodiment of the disclosure.

The disclosure provides an embodiment which does not require all of the S bits of the syndrome bits to be input into a logic gate (e.g. 201) to be compared with each of the K bits of input message bits. By doing so, the required area on a circuit layout could be reduced, and the power consumption needed for calculations could be lessened. In FIG. 3, for this exemplary embodiment, the circuit would may include a X bits weight correction circuit, a X−1 bits weight correction circuit, a X−2 bits weight correction circuit, and so forth. All the above described weight correction circuits would perform weight corrections simultaneously. Assuming that X=4 as an example, then the 4 bits weight correction circuit may include a first plurality of AND gates 301 which corresponds to a part of the syndrome matching circuit 122 and a plurality of XOR gates 312 corresponding to a part of the data correction circuit 123, and each of the first plurality of AND gates 301 would receive a first number of syndrome bits 304. The binary values of the first number of syndrome bits 304 are either 0 or 1 and expected to not be all 1 when there is no error in the message bits Din[K−M] to Din[K−1]. The quantity of the first number of syndrome bits 304 is 4 bits. This means that in general each of the first plurality of AND gates 301 would receive a 4 bits input. For example, four syndrome bits whose bit value may be 1 can be selected from the S bits of the syndrome bits to define 4 bits of the syndrome bits 304. Each of the first plurality of AND gates 301 would also output a corresponding correction mask from correction mask [K−M] to correction mask [K−1] for correcting a corresponding bit of the input message bit. Each of the first plurality of AND gates 301 are expected to output binary values of 0 as values of the correction masks [K−M] and [K−1] of the first set of correction masks when there is no error in the message bits Din[K−M] to Din[K−1].

As shown in FIG. 3, in the first plurality of AND gates 301, it would receive 4 inputs of binary values and consequently output a correction mask [K−1]. If the correction mask [K−1] is 0, it means that Din[K−1] which happens to be the most significant bit, does not have any error. However, assuming that the correction mask [K−1] is 1, then the correction mask [K−1] would flip the value of Din[K−1]. The correction mask [K−1] and Din[K−1] are to be received by the XOR gate 312 which is a part of the data correction circuit 123. According to a truth table of any typical XOR gate receiving a first input and a second input, a value of 1 for the first input would flip the value of the second input. This means that whenever the value of the correction mask [K−1] is 1, the XOR gate 312 would generate Dout [K−1] by flipping the binary value of Din[K−1]. The same principle applies for all the XOR gates in FIG. 3.

Further, the X−1 bits weight correction circuit may include a second plurality of AND gates 302 which corresponds to a part of the syndrome matching circuit 122, each of the second plurality of AND gates 302 would receive a second number of syndrome bits 305 which could be 6, 7, or 8 bits of the syndrome bits, and the binary values of the second number of syndrome bits 305 are expected to be either 0 or 1 when there is no error in the message bits Din[K−N] to Din[K−M−1]. For each of the second plurality of AND gates 302, three of the input bits are not inverted, and the rest of the input bits are inverted. Each of the second plurality of AND gates 302 may have the input bits being inverted as a different set. The exact design of the inversion may vary would depend on the particular decoding algorithm being used. However, similar to the first plurality of AND gates 301, the purpose of the second plurality of AND gates 302 is also to generate a correction mask having a binary value of 1 whenever a corresponding input bit has an error. Also, the second plurality of AND gates 302 are expected to output binary values of 0 as values of the correction masks [K−N] and [K−M−1] of the second set of correction masks when there is no error in the message bits Din[K−N] to Din[K−M−1].

Further, the X−2 bits weight correction circuit may include a third plurality of AND gates 303 which corresponds to a part of the syndrome matching circuit 122, each of the third plurality of AND gates 303 would receive a third number of syndrome bits 306 which could be all of the S bits of the syndrome bits, and the binary values of the third number of syndrome bits 306 are expected to be either 0 or 1 when there is no error in the message bits Din[0] to Din[K−N−1]. For each of the third plurality of AND gates 303, two of the input bits are not inverted, and the rest of the input bits are inverted. Each of the third AND gates 303 may have the input bits being inverted as a different set. The exact design of the inversion may vary would depend on the particular decoding algorithm being used. However, similar to the first and the second plurality of AND gates 301 302, the purpose of the third plurality of AND gates 303 is also to generate a correction mask having a binary value of 1 whenever a corresponding input bit has an error. Also, the third plurality of AND gates 303 are expected to output binary values of 0 as values of the correction masks [0] and

[K−N−1] of the third set of correction masks when there is no error in the message bits Din[0] to Din[K−N−1].

Figure 4:
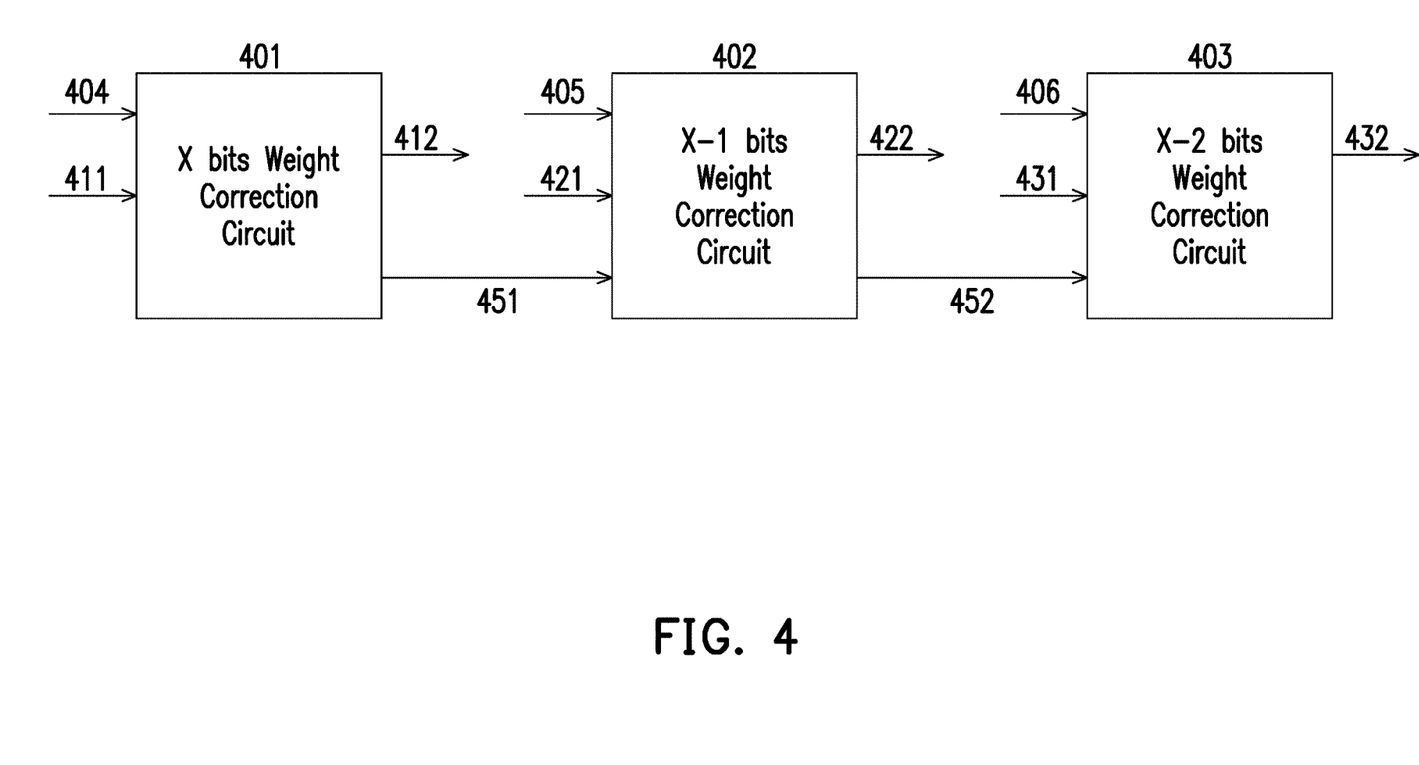
FIG. 4 illustrates a X-bits weight correction circuit according to a second exemplary embodiment of the disclosure.

According to another exemplary embodiment, instead of performing all weight correction calculations simultaneously, the weight correction calculation could be performed in several stages. FIG. 4 shows an embodiment of the syndrome matching circuit 122 and the data correction circuit 123 based on consecutive bits weight correction circuits. The circuit has Y stages (for example, Y is 3) which includes a X bits weight correction circuit, a X−1 bits weight correction circuit, and a X−2 bits weight correction circuit.

Referring to FIG. 4, the X bits weight correction circuit 401 configured to receive a first number of syndrome bits 404 and a first consecutive digits 411 (for example, including the message bits Din[K−M] to Din[K−1]) which is consecutive multiple bits in the K bits of the message bits Din[0] to Din[K−1], so as to generate an enable signal 451 of X−1 bits weight correction circuit and a first set of correction masks 412. Assuming that X=4, then the 4 bits weight correction circuit 401 would receive the first number of bits, which is 4, for correcting the first consecutive digits 411 in the K bits of the message bits Din[0] to Din[K−1]. Assuming that K=128, then the message bits would have 128 bits. Assuming that the number of bits of the first consecutive digits 411 is 16, then the 4 bits weight correction circuit 401 would correct the first 16 bits of the message bits, and the first bit of the 16 bits is the most significant bit. Assuming that no bit error has been detected, then the X bits weight correction circuit 401 would output the enable signal 451 with logic 0 to enable the X−1 bits weight correction circuit 402 and to output the first set of correction masks 412 corresponding to the first consecutive digits 411.

Next, the X−1 bits weight correction circuit 402 would be configured to receive a second number of syndrome bits 405, a second consecutive digits 421 (for example, including the message bits Din[K−N] to Din[K−M−1]) which is consecutive multiple bits in the K bits of the message bits Din[0] to Din[K−1], and the enable signal 451, so as to generate an enable signal 452 of X−2 bits weight correction circuit and a second set of correction masks 422. The second consecutive digits 421 are the digits that are right after the first consecutive digits 411 and do not overlap with the first consecutive digits 411. The X−1 bits weight correction circuit 402 is configured to correct one of the bits within the second consecutive digits 421. Assuming that no bit error has been detected, then the X−1 bits weight correction circuit 402 would output the enable signal 452 with logic 0 to enable the X−2 bits weight correction circuit 403 and to output the second set of correction masks 422 corresponding to the second consecutive digits 421.

Next, the X−2 bits weight correction circuit 403 is configured to receive a third number of syndrome bits 406 and a third consecutive digits 431 (for example, including the message bits Din[0] to Din[K−N−1]) which is consecutive multiple bits in the K bits of the message bits Din[0] to Din[K−1], so as to generate a third set of correction masks 432, wherein the third consecutive digits 431 in the K bits of the message bits Din[0] to Din[K−1] may include a least significant bit of the K bits of the message bits. The third number of bits of the S bits of syndrome bits could be X−2 bits (for example, 2 bits). The third consecutive digits 431 are the digits that are right after the second consecutive digits 421 and do not overlap with the second consecutive digits 421. The X−2 bits weight correction circuit 403 is configured to correct one of the bits within the third consecutive digits 431. Subsequently the X−2 bits weight correction circuit 403 would output the third set of correction masks 432 corresponding to the third consecutive digits 431.

Moreover, the X bits weight correction circuit 401 is configured to correct corresponding one of the first consecutive digits 411 of the K bits of the message bits and trigger the enable signal 451 to change a logic level (change to logic 1) to disable the X−1 bits weight correction circuit 402 in response to a corresponding correction mask of the first set of correction masks 412 having been detected. On the flip side, in response to the enable signal 451 with logic 0 having enabled the X−1 bits weight correction circuit 402, the X−1 bits weight correction circuit 402 would be configured to correct corresponding one of second consecutive digits 421 of the K bits of the message bits and trigger the enable signal 452 to change a logic level (change to logic 1) to disable the X−2 bits weight correction circuit 403 in response to a corresponding correction mask of the second set of correction masks 422 having been detected. Similarly, in response to the enable signal 452 of X−2 bits weight correction circuit having enabled the X−2 bits weight correction circuit 403, the X−2 bits weight correction circuit 403 would be configured to correct one of third consecutive digits 431 of the K bits of the message bits.

Figure 5:
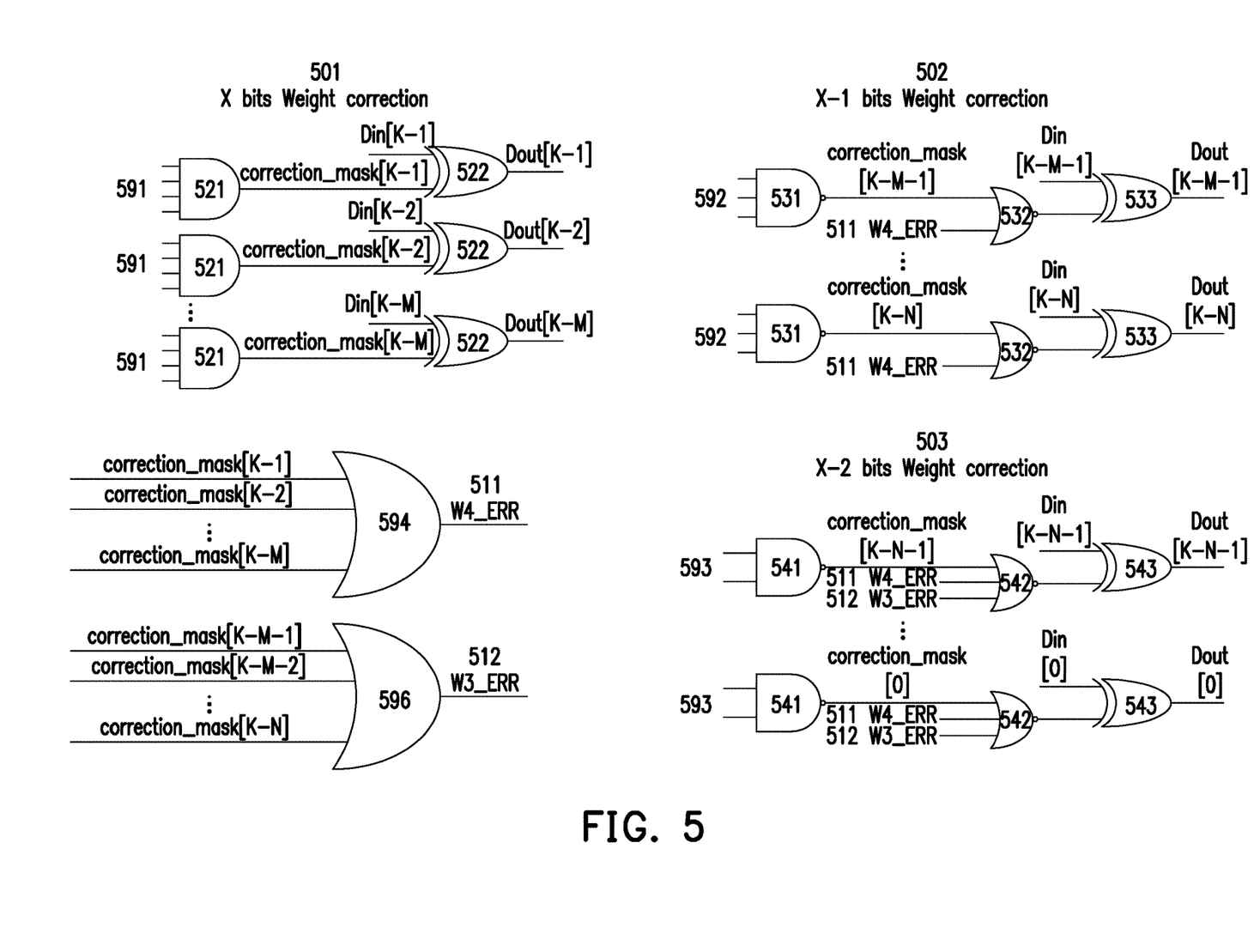
FIG. 5 illustrates a hardware diagram of the X-bits weight correction circuit according to a second exemplary embodiment of the disclosure.

The circuit of FIG. 4 is described with further details in FIG. 5. FIG. 5 shows one possible implementation of a X bits weight correction circuit 501 (i.e. 401), a X−1 bits weight correction circuit 502 (i.e. 402), and a X−2 bits weight correction circuit 503 (i.e. 403). For the X bits weight correction circuit 501, the structure is identical to FIG. 3 with the AND gates 521 corresponding to the AND gates 311 as each of the AND gates 521 would receive a first number of syndrome bits 591 and the XOR gates 522 corresponding to the XOR gates 312, thus the principle operation is not to be repeated.

The X−1 bits weight correction circuit 502 includes a plurality of NAND gates 531, and each of the NAND gates would receive the second number of syndrome bits 592, and there is an NOR gate 532 situated between the NAND gate 531 and an XOR gate 533 for each of the inputs of the X−1 bits weight correction circuit 502. The purpose of the NOR gate 532 is to receive W4_ERR signal 511 which disables the X−1 bits weight correction circuit 502 in response to the X bits weight correction circuit 501 having detected an error. The W4_ERR signal 511 is the same as the enable signal 451 of X−1 bits weight correction circuit previously described in FIG. 4. The W4_ERR signal 511 is output from a first OR gate 594 which receives all the correction masks from correction mask [K−M] until correction mask [K−2], correction mask [K−1]. This means that if any of the correction masks has a binary value of 1, then the W4_ERR signal 511 also has a binary value of 1 which nullifies the effect of the correction masks resulting the output of the NOR gate 532 as 0.

The X−2 bits weight correction circuit 503 includes a plurality of NAND gates 541 and each of the NAND gates would receive the third number of syndrome bits 593. There is an NOR gate 542 situated between the NAND gate 541 and an XOR gate 543 for each of the X−2 bits weight syndrome bit inputs. The purpose of the NOR gate 542 is to receive W4_ERR signal 511 as well as W3_ERR signal 512 which disable the X−2 bits weight correction circuit 503 respectively in response to the X bits weight correction circuit 501 and the X−1 bits weight correction circuit 502 having detected an error. The W3_ERR signal 512 is the same as the enable signal 452 of X−2 bits weight correction circuit previously described in FIG. 4. The W3 ERR signal 512 is output from a second OR gate 596 which receives all the correction masks from correction mask [K−N] until correction mask [K−M−2], correction mask [K−M−1]. This means that if any of the correction masks has a binary value of 1, then the W3_ERR signal 512 also has a binary value of 1 which nullifies the effect of the correction masks resulting the output of the NOR gate 542 as 0. This means that if either the X bits weight correction circuit 501 or the X−1 bits weight correction circuit 502 has detected an error, the X−2 bits weight correction circuit 503 would not correct any bit error.

Figure 6:
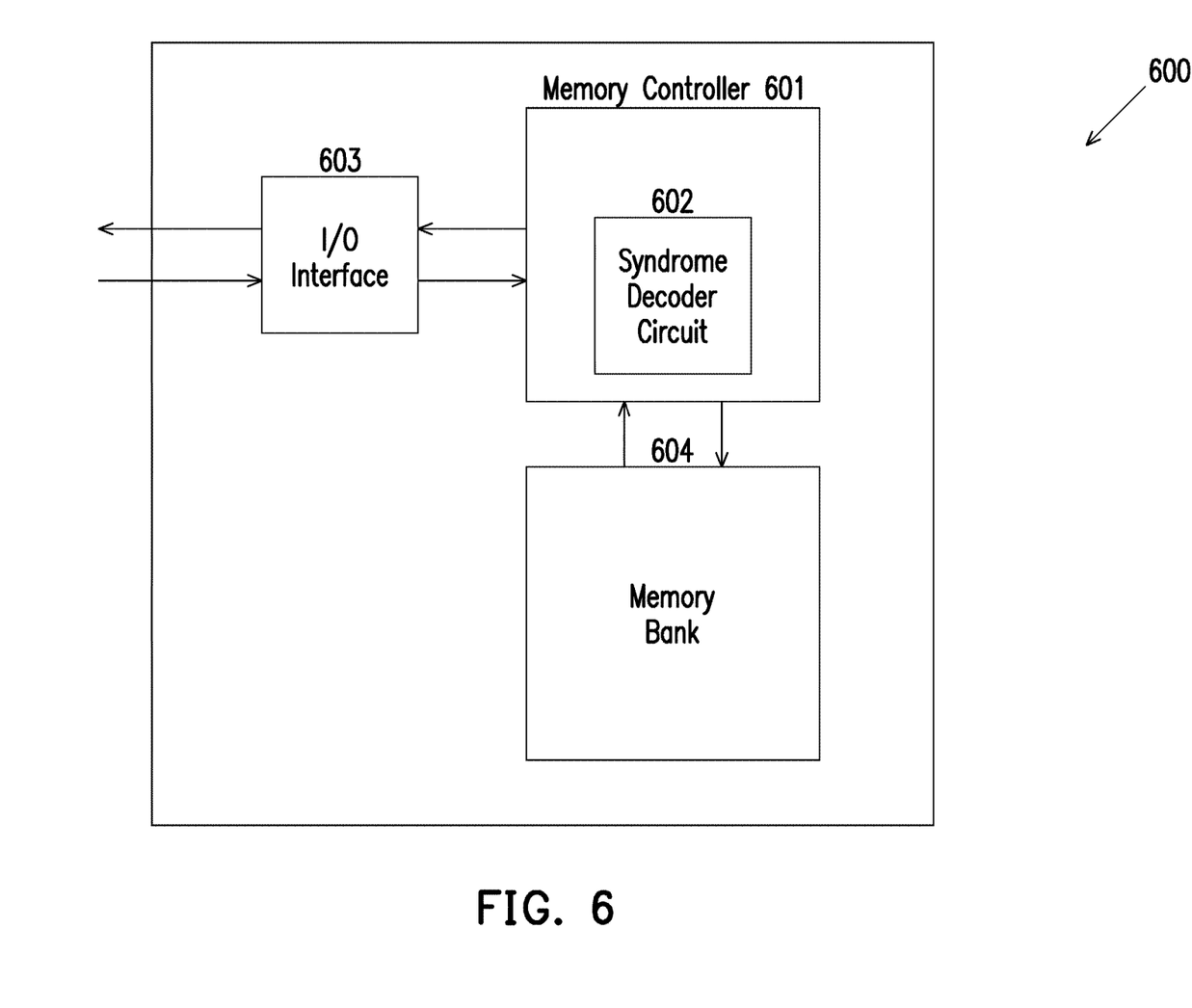
FIG. 6 illustrates a memory device having the syndrome encoder circuit according to an exemplary embodiment of the disclosure.

The disclosure provides a memory device 600 having the syndrome decoder circuit 602 as shown in FIG. 6. For a typical memory device (e.g. 600), the syndrome decoder circuit (e.g. 602) could be implemented as a part of the memory controller 601. However, the syndrome decoder circuit may also be implemented as a component in other parts of the memory device or in any other electronic device that has a need for correcting bit errors. The memory device 600 may include not limited to a memory controller 601 electrically connected to a memory bank 604 and an I/O interface 603. The I/O interface 603 is configured to receive a data which could be in the form of a received codeword for storage and to transmit data which has been stored in the memory bank 604. The memory bank 604 is configured to store data in a non-volatile manner. The memory controller 601 is configured to control the I/O interface 603 and the memory bank 604 and includes the syndrome decoder circuit 602. The details of the syndrome decoder circuit 602 have already been described and a repetition would not be necessary.

In view of the aforementioned descriptions, the disclosure is suitable for being used in any memory device having a decoder which requires lesser circuit areas and is able to correct errors with reduced power consumption.

What is claimed is:

1. A syndrome decoder circuit comprising:
   a syndrome computation circuit configured to receive K bits of message bits and P bits of parity bits so as to calculate S bits of syndrome bits;
   a X bits weight correction circuit configured to receive multiple sets of first number of bits of the S bits of syndrome bits and a first digits of the K bits of message bits so as to generate a first set of correction masks for the first digits of the K bits of message bits; and
   a X−1 bits weight correction circuit configured to receive multiple sets of second number of bits of the S bits of syndrome bits and a second digits of the K bits of message bits so as to generate a second set of correction masks for the second digits of the K bits of message bits, wherein K, P, and S are integers greater than 0, the first digits of the K bits of message bits include a most significant bit of the K bits of message bits, and the first set of correction masks and the second set of correction masks are generated simultaneously,
   wherein the first number is not equal to the second number.

2. The syndrome decoder circuit of claim 1 further comprising:
   a X−2 bits weight correction circuit configured to receive multiple sets of third number of bits of the S bits of syndrome bits and a third digits of the K bits of message bits so as to generate a third set of correction masks for the third digits of the K bits of message bits, wherein the third digits of the K bits of message bits include a least significant bit of the K bits of message bits and the third set of correction masks are generated simultaneously with the first set of correction masks and the second set of correction masks,
   wherein the third number is not equal to the second number.

3. The syndrome decoder circuit of claim 2, wherein the X−2 bits weight correction circuit comprises a third plurality of AND gates, each of the third plurality of AND gates is configured to receive the third number of syndrome bits of the S bits of syndrome bits and output the corresponding correction mask in the third set of correction masks, the correction masks included in the third set of correction masks are each corresponding to bits in the third digits of the K bits of message bits, wherein X−2 inputs of each of the third plurality of AND gates do not have inverters and the rest of the inputs of each of the third plurality of AND gates have inverters,
   wherein binary values of the third number of syndrome bits are 0 or 1.

4. The syndrome decoder circuit of claim 2, wherein X is 4, the first number of bits of the S bits of syndrome bits is 4, the second number of bits of the S bits of syndrome bits is 6, 7, or 8, and the third number of bits of the S bits of syndrome bits is 8.

5. The syndrome decoder circuit of claim 1, wherein the X bits weight correction circuit comprises a first plurality of AND gates, each of the first plurality of AND gates is configured to receive the first number of syndrome bits of the S bits of syndrome bits and output the corresponding correction mask in the first set of correction masks, the correction masks included in the first set of correction masks are each corresponding to bits in the first digits of the K bits of message bits,
   wherein binary values of the first number of syndrome bits are either 0 or 1, the first number of syndrome bits are four syndrome bits whose bit value may be 1 selected from the S bits of syndrome bits.

6. The syndrome decoder circuit of claim 1, wherein the X−1 bits weight correction circuit comprises a second plurality of AND gates, each of the second plurality of AND gates is configured to receive the second number of syndrome bits of the S bits of syndrome bits and output the corresponding correction mask in the second set of correction masks, the correction masks included in the second set of correction masks are each corresponding to bits in the second digits of the K bits of message bits, wherein X−1 inputs of each of the second plurality of AND gates do not have inverters and the rest of the inputs of each of the second plurality of AND gates have inverters,
   wherein binary values of the second number of syndrome bits are 0 or 1.

7. The syndrome decoder circuit of claim 1, wherein each of the first set of correction masks is output to an XOR gate which is configured to flip a corresponding one of the first digits of the K bits of message bits in response to a corresponding one of the first set of correction masks indicating an error, each of the second set of correction masks is output to an XOR gate which is configured to flip a corresponding one of the second digits of the K bits of message bits in response to a corresponding one of the second set of correction masks indicating an error.

8. A syndrome decoder circuit comprising:
   a syndrome computation circuit configured to receive K bits of message bits and P bits of parity bits so as to calculate S bits of syndrome bits;
   a X bits weight correction circuit configured to receive multiple sets of first number of bits of the S bits of syndrome bits and a first digits of the K bits of message bits so as to generate a X−1 bits enable signal and a first set of correction masks for the first digits of the K bits of message bits; and a X−1 bits weight correction circuit configured to receive multiple sets of second number of bits of the S bits of syndrome bits, a second digits of the K bits of message bits, and the X−1 bits enable signal so as to generate a X−2 bits enable signal and a second set of correction masks for the second digits of the K bits of message bits, wherein K, P, and S are integers greater than 0, the first digits of the K bits of message bits include a most significant bit of the K bits of message bits, and the second number is less than the first number.

9. The syndrome decoder circuit of claim 8 further comprising:

a X−2 bits weight correction circuit configured to receive multiple sets of third number of bits of the S bits of syndrome bits and a third digits of the K bits of message bits so as to generate a third set of correction masks for the third digits of the K bits of message bits, wherein the third digits of the K bits of message bits include a least significant bit of the K bits of message bits and the third number of bits of the S bits of syndrome bits is less than the second number of bits of the S bits of syndrome bits.

10. The syndrome decoder circuit of claim 9, wherein the X bits weight correction circuit is configured to correct corresponding one of the first digits of the K bits of message bits and trigger the X−1 bits enable signal to change a logic level to disable the X−1 bits weight correction circuit in response to a corresponding correction mask of the first set of correction masks having been detected.

11. The syndrome decoder circuit of claim 10, wherein in response to the X−1 bits enable signal having enabled the X−1 bits weight correction circuit, the X−1 bits weight correction circuit is configured to correct corresponding one of the second digits of the K bits of message bits and trigger the X−2 bits enable signal to change a logic level to disable the X−2 bits weight correction circuit in response to a corresponding correction mask of the second set of correction masks having been detected.

12. The syndrome decoder circuit of claim 11, wherein in response to the X−2 bits enable signal having enabled the X−2 bits weight correction circuit, the X−2 bits weight correction circuit is configured to correct corresponding one of the third digits of the K bits of message bits.

13. The syndrome decoder circuit of claim 9, wherein the X−2 bits weight correction circuit comprises a third plurality of AND gates, each of the third plurality of AND gates is configured to receive the third number of syndrome bits of the S bits of syndrome bits and output the corresponding correction mask in the third set of correction masks, the correction masks included in the third set of correction masks are each corresponding to bits in the third digits of the K bits of the message bits.

14. The syndrome decoder circuit of claim 9, wherein each of the third set of correction masks is output to an XOR gate which is configured to flip a corresponding one of the third digits of the K bits of message bits in response to a corresponding one of the third set of correction masks indicating an error and in response to the X−1 bits enable signal having enabled the X−1 bits weight correction circuit and the X−2 bits enable signal having enabled the X−2 bits weight correction circuit.

15. The syndrome decoder circuit of claim 8, wherein the X bits weight correction circuit comprises a first plurality of AND gates, each of the first plurality of AND gates is configured to receive the first number of syndrome bits of the S bits of syndrome bits and output the corresponding correction mask in the first set of correction masks, the correction masks included in the first set of correction masks are each corresponding to bits in the first digits of the K bits of the message bits.

16. The syndrome decoder circuit of claim 15, wherein the X−1 bits weight correction circuit comprises a second plurality of AND gates, each of the second plurality of AND gates is configured to receive the second number of syndrome bits of the S bits of syndrome bits and output the corresponding correction mask in the second set of correction masks, the correction masks included in the second set of correction masks are each corresponding to bits in the second digits of the K bits of message bits.

17. The syndrome decoder circuit of claim 8, wherein each of the first set of correction masks is output to an XOR gate which is configured to flip a corresponding one of the first digits of the K bits of the message bits in response to a corresponding one of the first set of correction masks indicating an error.

18. The syndrome decoder circuit of claim 17, wherein each of the second set of correction masks is output to an XOR gate which is configured to flip a corresponding one of the second digits of the K bits of message bits in response to a corresponding one of the second set of correction masks indicating an error and in response to the X−1 bits enable signal having enabled the X−1 bits weight correction circuit.

19. The syndrome decoder circuit of claim 8, wherein all of the first set of correction masks is output to a first OR gate which generates the X−1 bits enable signal, and all of the second set of correction masks is output to a second OR gate which generates the X−2 bits enable signal.

* * * * *